United States Patent
Zhang et al.

(10) Patent No.: US 12,389,770 B2
(45) Date of Patent: Aug. 12, 2025

(54) DISPLAY PANEL AND DISPLAY DEVICE

(71) Applicant: BOE TECHNOLOGY GROUP CO., LTD., Beijing (CN)

(72) Inventors: Xing Zhang, Beijing (CN); Pan Xu, Beijing (CN); Dacheng Zhang, Beijing (CN); Ying Han, Beijing (CN); Guoying Wang, Beijing (CN); Yi Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/927,051

(22) PCT Filed: Oct. 28, 2021

(86) PCT No.: PCT/CN2021/126980
§ 371 (c)(1),
(2) Date: Nov. 22, 2022

(87) PCT Pub. No.: WO2023/070427
PCT Pub. Date: May 4, 2023

(65) Prior Publication Data
US 2024/0334763 A1    Oct. 3, 2024

(51) Int. Cl.
*H10K 59/80*    (2023.01)
*G09G 3/3208*    (2016.01)
(Continued)

(52) U.S. Cl.
CPC ......... *H10K 59/131* (2023.02); *G09G 3/3208* (2013.01); *G09G 3/3266* (2013.01);
(Continued)

(58) Field of Classification Search
CPC .............. H10K 59/131; H10K 59/122; H10K 59/8722; H10K 59/873; H10K 59/88;
(Continued)

(56) References Cited

U.S. PATENT DOCUMENTS

2004/0108977 A1   6/2004  Hirayama
2016/0172428 A1*  6/2016  Song .................... H10K 59/131
                                                      257/40
(Continued)

FOREIGN PATENT DOCUMENTS

CN     1469333 A    1/2004
CN   103399670 A   11/2013
(Continued)

OTHER PUBLICATIONS

Chinese International Search Report in PCT/CN2021/126980 dated Jun. 17, 2022 with English translation.
(Continued)

*Primary Examiner* — Jeff W Natalini
*Assistant Examiner* — Brandon C Fox
(74) *Attorney, Agent, or Firm* — Collard & Roe, P.C.

(57) ABSTRACT

A display panel and a display device are provided, the display panel has a display region, a dummy pixel region and a circuit region, the display region includes a planarization layer and an encapsulation layer. The circuit region includes a plurality of wires and a frame sealant. The frame sealant overlaps with at least a part of the wires, the encapsulation layer overlaps with at least a part of the frame sealant. The planarization layer includes at least one groove in the circuit region, and overlapping with at least a part of the wires. A first side and a second side of the display region include a binding region, and at least one first chip-on-film in the first binding region on the first side and at least one second chip-on-film in the second binding region on the second side are centrosymmetric with respect to a center of the display region.

20 Claims, 9 Drawing Sheets

(51) Int. Cl.
  *G09G 3/3266* (2016.01)
  *H10K 59/122* (2023.01)
  *H10K 59/129* (2023.01)
  *H10K 59/131* (2023.01)
  *H10K 59/88* (2023.01)

(52) U.S. Cl.
  CPC ......... *H10K 59/122* (2023.02); *H10K 59/129* (2023.02); *H10K 59/80* (2023.02); *H10K 59/8722* (2023.02); *H10K 59/873* (2023.02); *H10K 59/8792* (2023.02); *H10K 59/88* (2023.02); *G09G 2310/08* (2013.01)

(58) Field of Classification Search
  CPC ...... H10K 59/129; H10K 59/80; H10K 59/87; G09G 3/3266; G09G 3/3208
  See application file for complete search history.

(56) References Cited

U.S. PATENT DOCUMENTS

| | | |
|---|---|---|
| 2017/0236886 A1 | 8/2017 | Matsueda |
| 2017/0317157 A1 | 11/2017 | Li et al. |
| 2018/0203287 A1 | 7/2018 | Wang et al. |
| 2018/0337226 A1* | 11/2018 | Liu ................... H10K 59/131 |
| 2019/0204977 A1 | 7/2019 | Ma et al. |
| 2020/0210044 A1* | 7/2020 | Kim .................. G06F 3/044 |
| 2020/0258958 A1 | 8/2020 | Gai et al. |
| 2022/0122541 A1* | 4/2022 | Chung .............. G09G 3/3258 |

FOREIGN PATENT DOCUMENTS

| | | |
|---|---|---|
| CN | 105633122 A | 6/2016 |
| CN | 105676520 A | 6/2016 |
| CN | 205353532 U | 6/2016 |
| CN | 105739154 A | 7/2016 |
| CN | 107086273 A | 8/2017 |
| CN | 108052232 A | 5/2018 |
| CN | 108493226 A | 9/2018 |
| CN | 109188801 A | 1/2019 |
| CN | 109411619 A | 3/2019 |
| CN | 111029378 A | 4/2020 |
| CN | 111192974 A | 5/2020 |
| CN | 111538178 A | 8/2020 |
| CN | 113471257 A | 10/2021 |
| JP | 2013243017 A | 12/2013 |

OTHER PUBLICATIONS

Chinese Written Opinion in PCT/CN2021/126980 dated Jun. 17, 2022.

Written Opinion of the International Searching Authority in PCT/CN2021/126980 dated Jun. 17, 2022 in English.

* cited by examiner

DISPLAY PANEL AND DISPLAY DEVICE

CROSS REFERENCE TO RELATED APPLICATIONS

This application is the National Stage of PCT/CN2021/126980 filed on Oct. 28, 2021 the disclosure of which is incorporated by reference.

TECHNICAL FIELD

Embodiments of the present disclosure relate to a display panel and a display device.

BACKGROUND

OLED (Organic Light Emitting Diode) display devices have a series of advantages such as self-luminescence, high contrast, high definition, wide viewing angle, low power consumption, fast response speed, low manufacturing cost, and so on, and have become one of the key development directions of the new generation of display devices, so the OLED display devices have received more and more attention.

An organic light-emitting diode as a light-emitting device in an OLED display device generally includes an anode, a cathode, and an organic functional layer, such as a light-emitting layer, between the anode and the cathode. When appropriate voltages are applied to the anode and the cathode of the organic light-emitting diode, holes injected from the anode and electrons injected from the cathode are combined in the light-emitting layer and excited to generate light.

For a large-size OLED display device, the width of the bezel is an important factor affecting the visual effect. Generally speaking, the narrower the bezel, the better the visual effect.

SUMMARY

At least one embodiment of the present disclosure provides a display panel, the display panel has a display region, and a dummy pixel region and a circuit region sequentially arranged on at least one side of the display region and in a direction away from the display region, and comprises a base substrate, the display region has a plurality of display sub-pixels arranged in a plurality of rows and columns, and comprises a pixel driving circuit layer on the base substrate, a planarization layer on a side of the pixel driving circuit layer away from the base substrate, a light-emitting device layer on a side of the planarization layer away from the base substrate, and an encapsulation layer on a side of the light-emitting device layer away from the base substrate, and each of the plurality of the display sub-pixels comprises a pixel driving circuit in the pixel driving circuit layer and a light-emitting device in the light-emitting device layer; the dummy pixel region comprises a plurality of dummy sub-pixels on the base substrate; the circuit region comprises a plurality of wires on the base substrate and a frame sealant on a side of the plurality of wires away from the base substrate; in a direction perpendicular to the base substrate, the frame sealant overlaps with at least a pan of the plurality of wires, the encapsulation layer further extends to the circuit region, and overlaps with at least a part of the frame sealant, the planarization layer further extends to the circuit region, and comprises at least one groove in the circuit region, and the at least one groove overlaps with at least a part of the plurality of wires; and the at least one side comprises a first side and a second side on opposite sides of the display region, the first side and the second side further comprise a binding region on a side of the circuit region away from the display region, the binding region comprises a first binding region on the first side and a second binding region on the second side, the first binding region comprises at least one first chip-on-film, the second binding region comprises at least one second chip-on-film, and the at least one first chip-on-film and the at least one second chip-on-film are centrosymmetric with respect to a center of the display region.

For example, in the display panel provided by at least one embodiment of the present disclosure, the first chip-on-film is configured to provide electrical signals to display sub-pixels in odd-numbered columns among the plurality of rows and columns of display sub-pixels, and the second chip-on-film is configured to provide electrical signals to display sub-pixels in even-numbered columns among the plurality of rows and columns of display sub-pixels; or the first chip-on-film is configured to provide electrical signals to display sub-pixels in even-numbered columns among the plurality of rows and columns of display sub-pixels, and the second chip-on-film is configured to provide electrical signals to display sub-pixels in odd-numbered columns among the plurality of rows and columns of display sub-pixels.

For example, in the display panel provided by at least one embodiment of the present disclosure, the circuit region further comprises an electrostatic discharge circuit on the first side and the second side, respectively, the plurality of wires comprise a sensing line extending in a first direction, and the sensing line is configured to provide a sensing signal to the pixel driving circuit; and the electrostatic discharge circuit comprises a plurality of electrostatic discharge portions, and in a second direction perpendicular to the first direction, the plurality of electrostatic discharge portions are symmetrically distributed with respect to the sensing line.

For example, in the display panel provided by at least one embodiment of the present disclosure, the plurality of wires further comprise a plurality of data lines extending along the first direction, the plurality of data lines are configured to provide a data signal to the pixel driving circuit, and the plurality of data lines are respectively on a side of the plurality of electrostatic discharge portions away from the sensing line.

For example, in the display panel provided by at least one embodiment of the present disclosure, the display region further comprises a passivation layer on a side of the pixel driving circuit layer away from the base substrate, the passivation layer further extends to the circuit region and is on a side of the plurality of wires away from the base substrate, and the frame sealant is on a side of the passivation layer away from the base substrate and is in direct contact with the passivation layer.

For example, in the display panel provided by at least one embodiment of the present disclosure, in a direction away from the display region, the circuit region comprises a power bus region, a fan-out signal line region and a transfer signal line region on the first side and the second side, respectively, and the frame sealant comprises a first part in the fan-out signal line region and a second part in the transfer signal line region.

For example, in the display panel provided by at least one embodiment of the present disclosure, the power bus region comprises a first power bus, and a first end of the first power bus is electrically connected to first power lines of the plurality of display sub-pixels.

For example, in the display panel provided by at least one embodiment of the present disclosure, a second end of the first power bus opposite to the first end is connected to the at least one first chip-on-film or the at least one second chip-on-film through a plurality of power lead lines, respectively.

For example, in the display panel provided by at least one embodiment of the present disclosure, the fan-out signal line region comprises a plurality of fan-out signal lines, and in the fan-out signal line region, the plurality of fan-out signal lines and the plurality of power lead lines are alternately arranged.

For example, in the display panel provided by at least one embodiment of the present disclosure, the at least one groove comprises a first groove on the first side and the second side, respectively, and in the direction perpendicular to the base substrate, at least a part of the first groove is in the power bus region.

For example, in the display panel provided by at least one embodiment of the present disclosure, the at least one side further comprises a third side and a fourth side on opposite sides of the display region, the third side and the fourth side respectively comprise a first gate scanning driving circuit and a second gate scanning driving circuit, and the first scanning driving circuit is on a side of the second scanning driving circuit close to the display region; one of the first gate scanning driving circuit and the second gate scanning driving circuit is a row scanning driving circuit and is configured to provide a row scanning signal to the plurality of display sub-pixels, and another one of the first gate scanning driving circuit and the second gate scanning driving circuit is a light-emitting scanning driving circuit and is configured to provide a light-emitting control signal to the plurality of display sub-pixels; and the at least one groove further comprises a second groove between the first gate scanning driving circuit and the second gate scanning driving circuit.

For example, in the display panel provided by at least one embodiment of the present disclosure, the light-emitting device layer comprises a first electrode layer that is continuously arranged for the light-emitting device; on the first side and the second side and in the direction perpendicular to the base substrate, the first electrode layer at least partially overlaps with the first groove; and on the third side and the fourth side and in the direction perpendicular to the base substrate, the first electrode layer does not overlap with the second groove.

For example, in the display panel provided by at least one embodiment of the present disclosure, the display region further comprises a pixel definition layer on a side of the planarization layer away from the base substrate, and the at least one groove penetrates through the planarization layer and the pixel definition layer.

For example, in the display panel provided by at least one embodiment of the present disclosure, the encapsulation layer comprises an inorganic encapsulation layer, and the inorganic encapsulation layer extends to a side of the frame sealant close to the base substrate; the circuit region further comprises a plurality of clock signal lines on the third side and the fourth side, respectively, and the plurality of clock signal lines are on a side of the second scanning driving circuit away from the display region; and orthographic projections of the plurality of clock signal lines on the base substrate are within an orthographic projection of the inorganic encapsulation layer on the base substrate.

For example, in the display panel provided by at least one embodiment of the present disclosure, on the first side and the second side, the inorganic encapsulation layer terminates in the fan-out signal line region.

For example, in the display panel provided by at least one embodiment of the present disclosure, on the first side, the second side, the third side and the fourth side, the inorganic encapsulation layer terminates on a surface of the frame sealant close to the base substrate.

For example, in the display panel provided by at least one embodiment of the present disclosure, the display region further comprises a black matrix layer on a side of the encapsulation layer away from the base substrate; the black matrix layer extends into the circuit region on the third side and the fourth side; and the first gate scanning driving circuit and the second gate scanning driving circuit respectively comprise a plurality of thin film transistors, and orthographic projections of the plurality of thin film transistors on the base substrate are within an orthographic projection of the black matrix layer on the base substrate.

For example, in the display panel provided by at least one embodiment of the present disclosure, orthographic projections of the plurality of clock signal lines on the base substrate do not overlap with the orthographic projection of the black matrix layer on the base substrate.

At least one embodiment of the present disclosure further provides a display device, the display device comprises any one of the display panels provided above.

BRIEF DESCRIPTION OF THE DRAWINGS

In order to clearly illustrate the technical solutions of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

For example, in a large-size OLED display device, in a display region, a 3T1C pixel driving circuit can be used to drive a light-emitting device to emit light. For example, FIG. 1A illustrates a schematic diagram of a 3T1C pixel driving circuit, and FIG. 1B is a timing diagram of the pixel driving circuit in FIG. 1A.

Figure 1A:
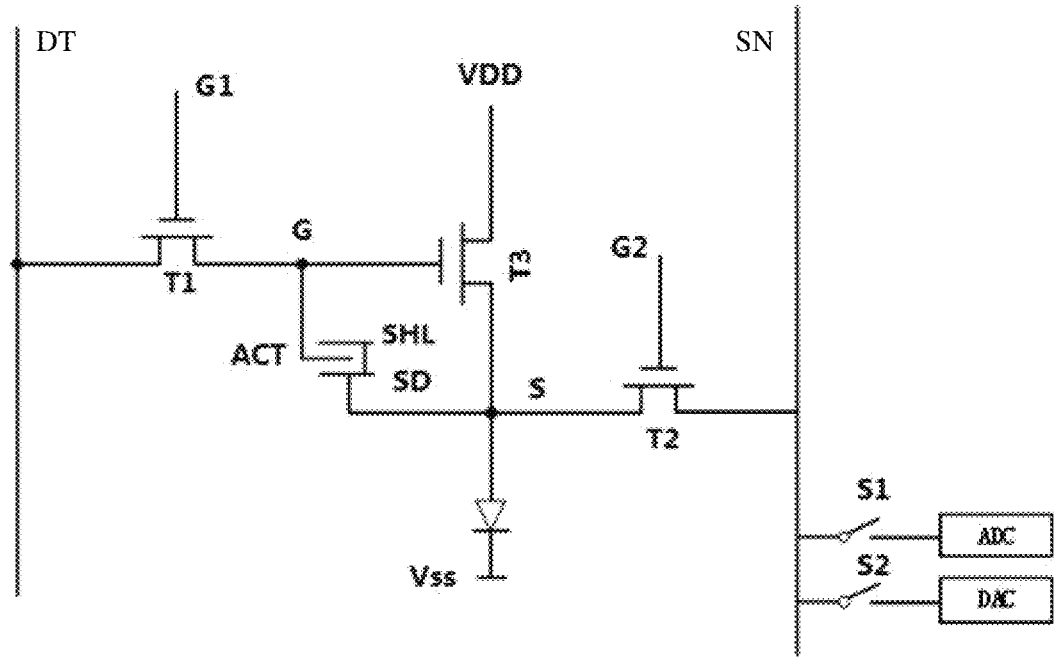
FIG. 1A is a circuit diagram of a pixel driving circuit of a display panel.
Figure 1B:
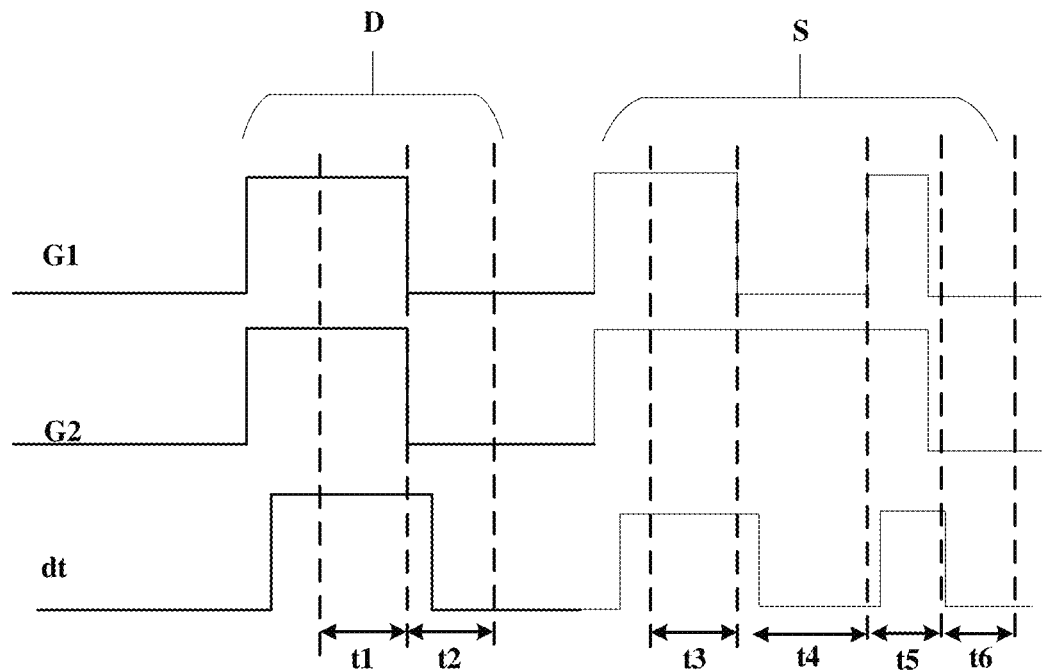
FIG. 1B is a timing diagram of the pixel driving circuit in FIG. 1A.

For example, as illustrated in FIG. 1A and FIG. 1B, the pixel driving circuit includes structures such as a first transistor T1, a second transistor T2, a third transistor T3, and a storage capacitor. The storage capacitor includes a first electrode plate ACT and second electrode plates SHL and SD. The pixel driving circuit is connected to signal lines such as a data line DT, a sensing line SN, a high-level power line VDD, a low-level power line Vss and the like, and is connected to components such as a digital-to-analog converter DAC, an analog-to-digital converter ADC and the like, and has the connection relationship as illustrated in the figure.

During the working process of the above-mentioned 3T1C pixel driving circuit, in combination with FIG. 1A and FIG. 1B, during a period t1, a first control signal G1 and a second control signal G2 are turn-on signals and are input to a gate electrode of the second transistor T2 and a gate electrode of the third transistor T3, and the second transistor T2 and the third transistor T3 are turned on. A data signal dt is transmitted to the gate electrode of the first transistor T1 through the second transistor T2, the first transistor T1 is turned on, and a sensing IC writes a reset signal Vint to a first electrode (e.g., an anode) of a light-emitting device through the sensing line SN and the second transistor T2.

During a period t2, the first control signal G1 and the second control signal G2 are turn-off signals, the voltage across the storage capacitor remains unchanged, and the first transistor T1 operates in a saturated state with a constant current, and drives the light-emitting device to emit light.

In this case, if the pixel row where the light-emitting device is located needs to be compensated, a sensing stage S is entered, that is, periods t3-t6.

During a period t3, the first control signal G1 and the second control signal G2 are turn-on signals and are input to the gate electrode of the second transistor T2 and the gate electrode of the third transistor T3, and the second transistor T2 and the third transistor T3 are turned on. The data signal dt is transmitted to the gate electrode of the first transistor T1 through the second transistor T2, the third transistor T3 is turned on, and the sensing IC writes the reset signal Vint to the first electrode (e.g., an anode) of the light-emitting device through the sensing line SN and the second transistor T2.

During a period t4, the first transistor T1 is turned off, and the second transistor T2 and the third transistor T3 are turned on. The parasitic capacitance of the sensing line SN is discharged through a point S until Vgs of the third transistor T3 meets Vgs=Vth, the third transistor T3 is turned off, in this case, the sensing IC can calculate Vth of the third transistor after obtaining the potential of the point S, and can further calculate characteristic parameters such as the mobility and the like of the third transistor according to a discharge curve at the point S during the sensing stage.

During a period t5, the first transistor T1 is turned on, and the data line DT writes a data voltage to the gate electrode of the third transistor T3. Because the pixel row where the light-emitting device is located does not emit light during the sensing stage, a dark line will appear during display. Therefore, after the end of the period t4, a data voltage is written immediately to enable the pixel row to emit light, so as to reduce the influence of the dark line on the display effect.

During a period t6, the first transistor T1 and the second transistor T2 are turned off, and the light-emitting device emits light.

The above-mentioned period t5 and period t6 are timing sequences added for power-on compensation, and the period t5 and period t6 are not required in power-off compensation.

For example, signal lines such as the data line DT, the sensing line SN and the like of the above-mentioned 3T1C pixel driving circuit may extend to a peripheral region of the display device, and a driving circuit is provided in the peripheral region to provide driving signals for the above-mentioned signal lines. In the peripheral region, how to arrange the above-mentioned driving circuit and respective signal lines is an important research topic for implementing a narrow bezel.

At least one embodiment of the present disclosure provides a display panel, the display panel has a display region, and a dummy pixel region and a circuit region sequentially arranged on at least one side of the display region and in a direction away from the display region, and includes a base substrate. The display region has a plurality of display sub-pixels arranged in a plurality of rows and columns, and includes a pixel driving circuit layer on the base substrate, a planarization layer on a side of the pixel driving circuit layer away from the base substrate, a light-emitting device layer on a side of the planarization layer away from the base substrate, and an encapsulation layer on a side of the light-emitting device layer away from the base substrate, and each of the plurality of the display sub-pixels includes a pixel driving circuit in the pixel driving circuit layer and a light-emitting device in the light-emitting device layer; the dummy pixel region includes a plurality of dummy sub-pixels on the base substrate, and the circuit region includes a plurality of wires on the base substrate and a frame sealant on a side of the plurality of wires away from the base substrate; in a direction perpendicular to the base substrate, the frame sealant overlaps with at least a part of the plurality of wires, the encapsulation layer further extends to the circuit region, and overlaps with at least a part of the frame sealant, the planarization layer further extends to the circuit region, and includes at least one groove in the circuit region, and the at least one groove overlaps with at least a part of the plurality of wires; the at least one side includes a first side and a second side on opposite sides of the display region, the first side and the second side further include a binding region on a side of the circuit region away from the display region, the binding region includes a first binding region on the first side and a second binding region on the second side, the first binding region includes at least one first chip-on-film, the second binding region includes at least one second chip-on-film, and the at least one first chip-on-film and the at least one second chip-on-film are centrosymmetric with respect to a center of the display region.

The above-mentioned display panel provided by the embodiments of the present disclosure adopts a technical solution of dual-sided driving of the chip-on-film, and can have a more compact structure in the peripheral region, and respective functional layers in the peripheral region can make full use of the space of respective parts of the peripheral region to implement corresponding functions, and therefore a narrow bezel design, such as an extremely narrow bezel design, can be achieved.

Hereinafter, the display panel and the display device provided by the embodiments of the present disclosure will be described in detail through several specific embodiments.

Figure 2:
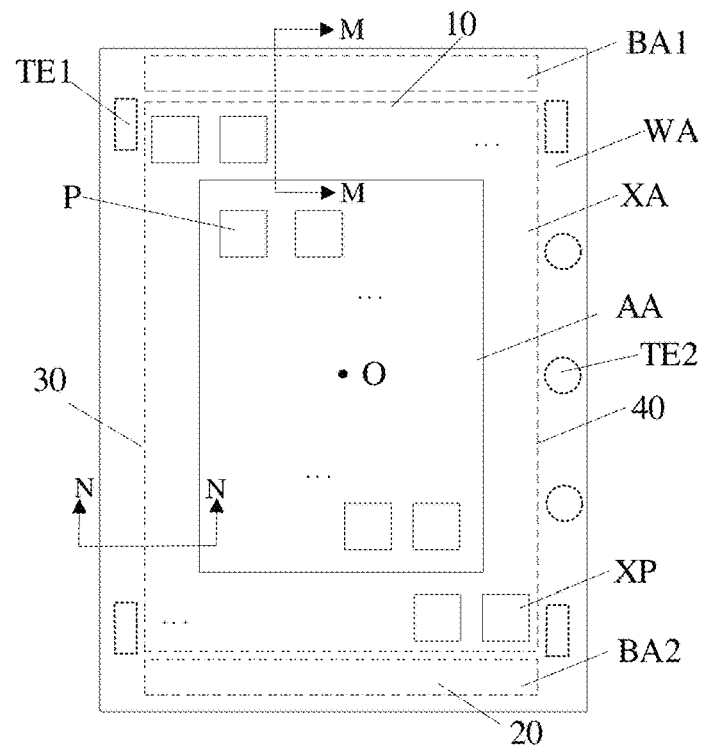
FIG. 2 is a schematic plan view of a display panel provided by at least one embodiment of the present disclosure.

FIG. 2 is a schematic plan view of a display panel provided by at least one embodiment of the present disclosure. As illustrated in FIG. 2, the display panel includes a display region AA, and a dummy pixel region XA and a circuit region WA sequentially arranged on at least one side of the display region AA and in a direction away from the display region AA.

Figure 3:
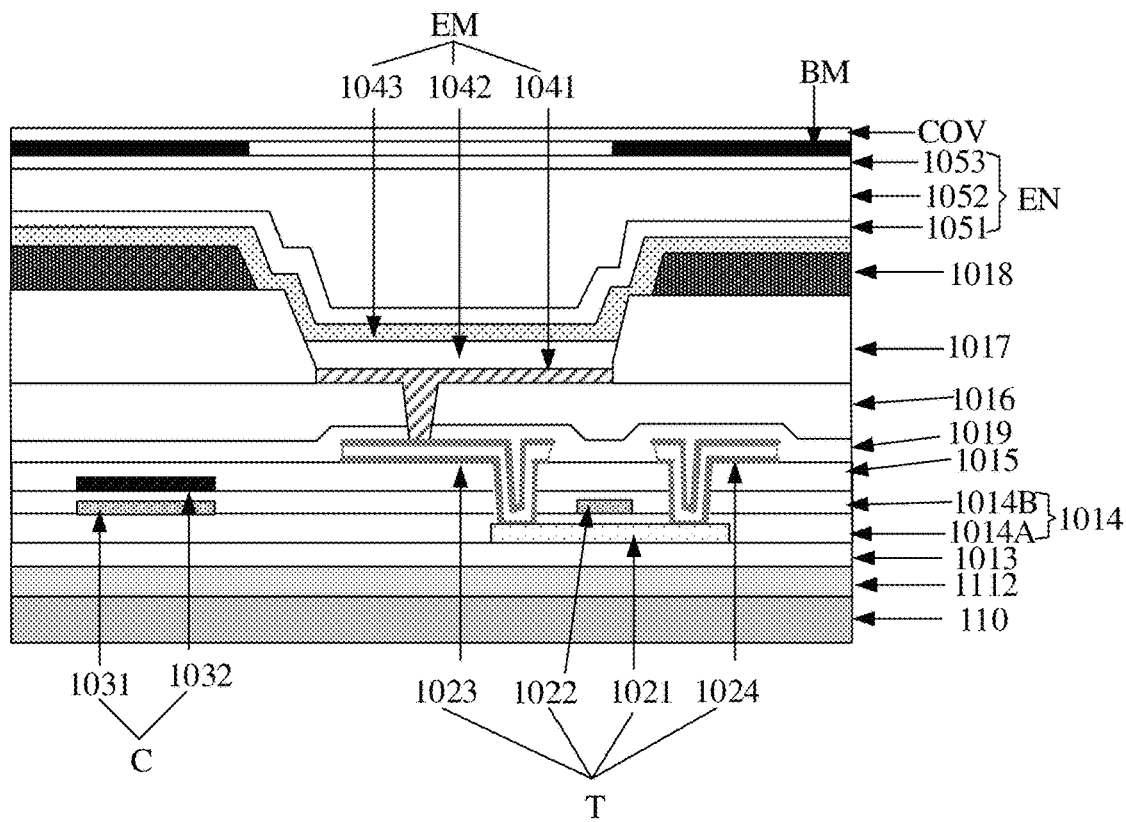
FIG. 3 is a schematic partial cross-sectional view of a display region in a display panel provided by at least one embodiment of the present disclosure.

As illustrated in FIG. 2, the display region AA includes a plurality of display sub-pixels P arranged in a plurality of rows and columns, and the plurality of display sub-pixels P can be driven to display images. For example, FIG. 3 illustrates a schematic partial cross-sectional view of a display sub-pixel P. As illustrated in FIG. 3, the display panel includes a base substrate 110, and the display region AA includes a pixel driving circuit layer on the base substrate 110, a planarization layer 1016 on a side of the pixel driving circuit layer away from the base substrate 110, a light-emitting device layer on a side of the planarization layer 1016 away from the base substrate 110, and an encapsulation layer EN on a side of the light-emitting device layer away from the base substrate 110. Each of the plurality of the display sub-pixels P includes a pixel driving circuit in the pixel driving circuit layer and a light-emitting device EM in the light-emitting device layer.

For example, as illustrated in FIG. 2, the pixel driving circuit includes structures such as a thin film transistor T, a storage capacitor C, and the like. The thin film transistor T includes an active layer 1021, a gate electrode 1022, a gate insulating layer 1014 (for example, including a first gate insulating layer 1014A and the second gate insulating layer 1014B), an interlayer insulating layer 1015, and source and drain electrodes (including a source electrode 1023 and a drain electrode 1024). The storage capacitor C includes a first capacitor electrode plate 1031 and a second capacitor electrode plate 1032. For example, the first capacitor electrode plate 1031 and the gate electrode 1022 are provided in the same layer, and the second capacitor electrode plate 1032 is between the gate insulating layer 1014 and the interlayer insulating layer 1015. The light-emitting device EM includes structures such as a first electrode layer 1043, a second electrode layer 1041, a light-emitting material layer 1042 between the first electrode layer 1043 and the second electrode layer 1041, and the like, and the second electrode layer 1041 is connected to the source electrode 1023 of the thin film transistor through a via in the planarization layer 1016.

In the embodiments of the present disclosure, "provided in the same layer" means that two functional layers or structural layers are formed in the same layer and with the same material in the hierarchical structure of the display substrate, that is, in the manufacturing process, the two functional layers or structural layers can be formed of the same material layer, and the required patterns and structures can be formed through the same patterning process. Thereby, the manufacturing process of the display panel is simplified.

For example, as illustrated in FIG. 2, the dummy pixel region XA includes a plurality of dummy sub-pixels XP on the base substrate 110, and each dummy sub-pixel XP, for example, has the same or similar structure as the display sub-pixel P, but is not used for display. For example, each dummy sub-pixel XP may have the same structure as the display sub-pixel P, but is not connected to a signal line, so that it will not be driven; or, each dummy sub-pixel XP may have a similar structure as the display sub-pixel P, but lack some necessary functional layers, so that the structure is not complete compared with the display sub-pixel P, and thus cannot be driven. The embodiments of the present disclosure do not limit the specific structure of the dummy sub-pixel XP.

For example, the dummy sub-pixels XP may be arranged around the display region AA. For example, around the display region AA, on four sides, the dummy sub-pixels XP may be arranged in 1-5 layers, that is, in the same direction, there are 1-5 dummy sub-pixels XP on both sides of the display sub-pixel P, respectively, one dummy sub-pixel XP is illustrated in FIG. 2 as an example. For example, in some embodiments, in the display region AA, every three or four display sub-pixels P constitute a repeating unit, and a plurality of repeating units are arranged in an array. For example, the four display sub-pixels P in one repeating unit may be a red sub-pixel, a green sub-pixel, a blue sub-pixel and a white sub-pixel, respectively, or one red sub-pixel, two green sub-pixels and one blue sub-pixel pixel, respectively. Alternatively, the three display sub-pixels P in one repeating unit may be a red sub-pixel, a green sub-pixel and a blue sub-pixel, respectively. The embodiments of the present disclosure do not limit the specific form of each repeating unit.

For example, the dummy sub-pixels XP arranged around the display region AA may be arranged in a row or column in the unit of one repeating unit, or may be arranged in a row or column in the unit of less than one repeating unit (e.g., 0.5 repeating unit). The embodiments of the present disclosure do not limit the specific setting manner of the dummy sub-pixels XP.

Figure 4:
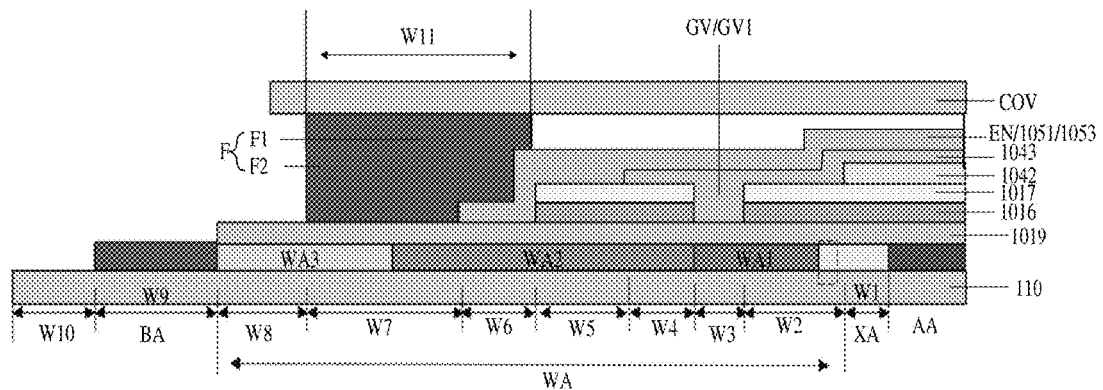
FIG. 4 is a schematic cross-sectional view of the display panel in FIG. 2 along a line M-M.
Figure 5:
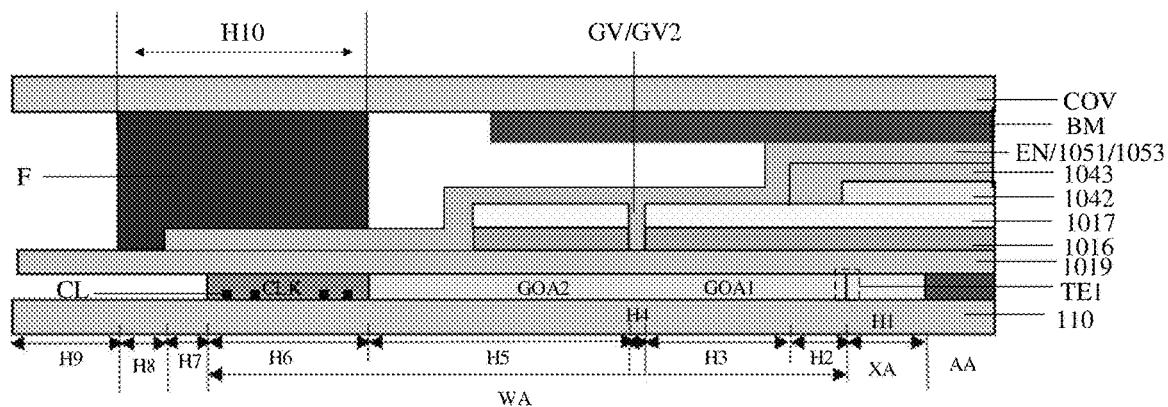
FIG. 5 is a schematic cross-sectional view of the display panel in FIG. 2 along a line N-N.

For example, FIG. 4 and FIG. 5 show schematic cross-sectional views of the display panel in FIG. 2 along a line M-M and a line N-N, respectively. As illustrated in FIG. 4 and FIG. 5, the circuit region WA includes a plurality of wires (for example, in FIG. 4, at least part of the regions WA1, WA2 and WA3 include a plurality of wires, and in FIG. 5, the region CLK and the regions GOA1/GOA2 include a plurality of wires, which will be described in detail later) on the base substrate 110 and a frame sealant F on the side of the plurality of wires away from the base substrate 110. For example, in the direction perpendicular to the base substrate 110 (i.e., in the vertical direction in the figure), the frame sealant F overlaps with at least a part of the plurality of wires. Therefore, the frame sealant F and the at least a part of the plurality of wires occupy substantially the same space on the base substrate 110, so as to implement the effect of fully utilizing the space and reducing the bezel.

For example, the encapsulation layer EN may be a composite encapsulation layer, for example, including a first inorganic encapsulation layer 1051, a second organic encapsulation layer 1052 and a third inorganic encapsulation layer 1053; or, in other embodiments, the encapsulation layer EN may also include more or fewer encapsulation layers. For example, at least a part of the encapsulation layer EN (e.g., the first inorganic encapsulation layer 1051 and/or the third inorganic encapsulation layer 1053) further extends to the circuit region WA and overlaps with at least a part of the frame sealant F, so as to fully implement the encapsulation effect.

For example, the planarization layer 1016 further extends to the circuit region WA, and includes at least one groove GV in the circuit region WA, and the at least one groove GV overlaps with at least a part of the plurality of wires. The groove GV can cut off the channel through which impurities such as water and oxygen enter the interior of the display panel along the interface of the planarization layer 1016, so as to block impurities such as water and oxygen and protect the display panel.

For example, as illustrated in FIG. 2, the at least one side includes a first side 10 and a second side 20 on opposite sides of the display region AA, and the first side 10 and the second side 20 have substantially the same or similar structures, for example. As illustrated in FIG. 4, the first side 10 and the second side 20 further respectively include a binding region BA on a side of the circuit region WA away from the display region AA. For example, FIG. 6A illustrates another schematic plan view of the display panel, combined with FIG. 2 and FIG. 6A, the binding region BA includes a first binding region BA1 on the first side 10 and a second binding region BA2 on the second side 20, the first binding region BA1 includes at least one first chip-on-film COF1, the second bonding region BA2 includes at least one second chip-on-film COF2, and the at least one first chip-on-film COF1 and the at least one second chip-on-film COF2 are centrosymmetric with respect to the center O of the display region AA.

Figure 6A:
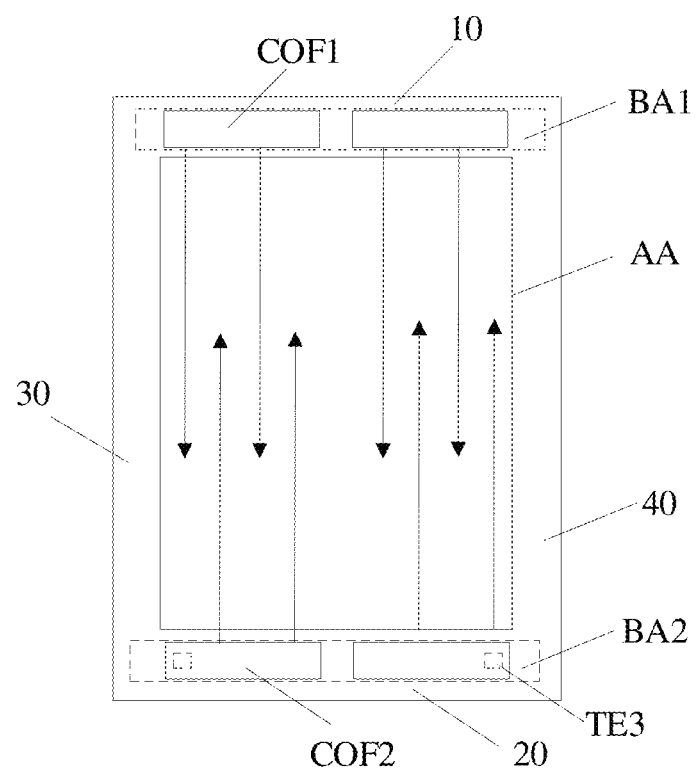
FIG. 6A is another schematic plan view of a display panel provided by at least one embodiment of the present disclosure.

For example, FIG. 6A illustrates two first chip-on-films COF1 and two second chip-on-films COF2 as an example. In other embodiments, the number of the first chip-on-films COF1 and the number of the second chip-on-films COF2 may also be one or more than two, which are not specifically limited in the embodiments of the present disclosure.

For example, in some embodiments, the first chip-on-film COF1 is configured to provide electrical signals, such as data signals, power signals, etc., to display sub-pixels P in odd-numbered columns among the plurality of rows and columns of display sub-pixels P, and the second chip-on-film COF2 is configured to provide electrical signals, such as data signals, power signals, etc., to display sub-pixels P in even-numbered columns among the plurality of rows and columns of display sub-pixels P; or, in other embodiments, the first chip-on-film COF1 is configured to provide electrical signals to display sub-pixels P in even-numbered columns among the plurality of rows and columns of display sub-pixels P, and the second chip-on-film COF2 is configured to provide electrical signals to display sub-pixels P in odd-numbered columns among the plurality of rows and columns of display sub-pixels P.

Figure 6B:
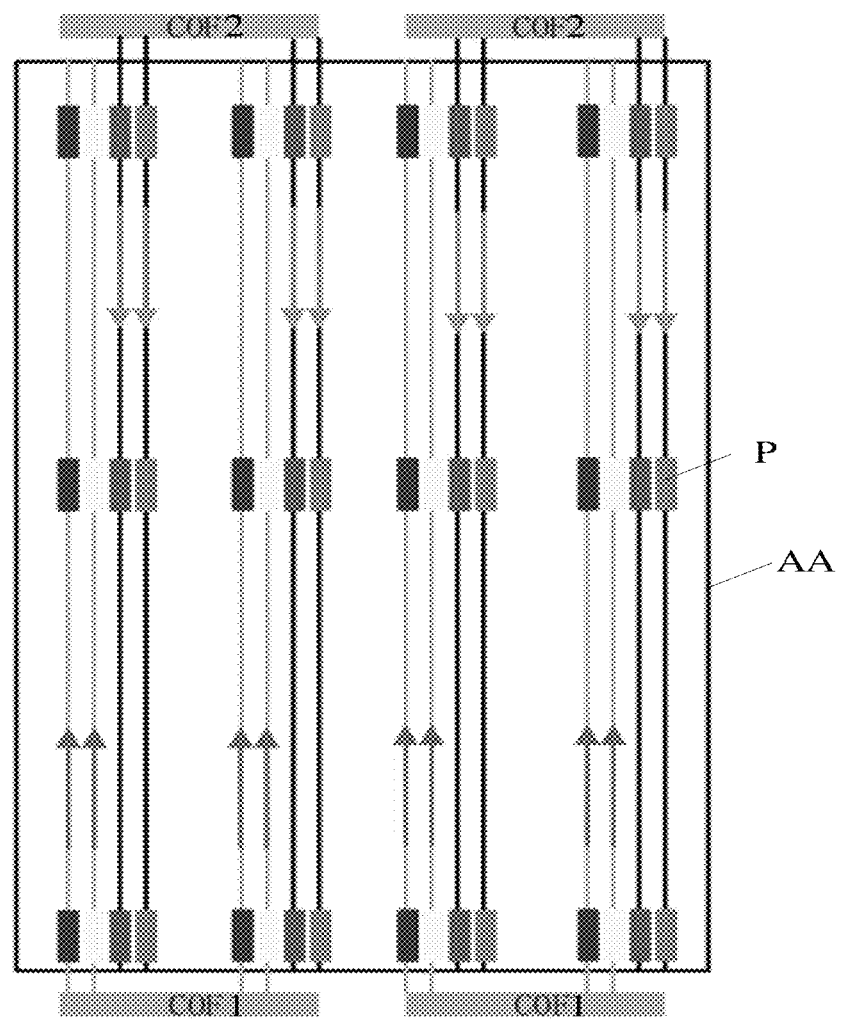
FIG. 6B is still another schematic plan view of a display panel provided by at least one embodiment of the present disclosure.

For example, in other embodiments, as illustrated in FIG. 6B, the plurality of columns of display sub-pixels P are divided into a plurality of groups, and each group includes two columns of display sub-pixels P. In this case, the first chip-on-film COF1 may be configured to provide electrical signals, such as data signals, power signals, etc., to display sub-pixels P in odd-numbered groups, and the second chip-on-film COF2 is configured to provide electrical signals, such as data signals, power signals, etc., to display sub-pixels P in even-numbered groups; or the first chip-on-film COF1 is configured to provide electrical signals to display sub-pixels P in even-numbered groups, and the second chip-on-film COF2 is configured to provide electrical signals to display sub-pixels P in odd-numbered groups. For example, in some embodiments, each group may also include more columns of display sub-pixels P, such as three columns, four columns, or five columns, etc., and be driven in the above-mentioned manner.

Figure 6C:
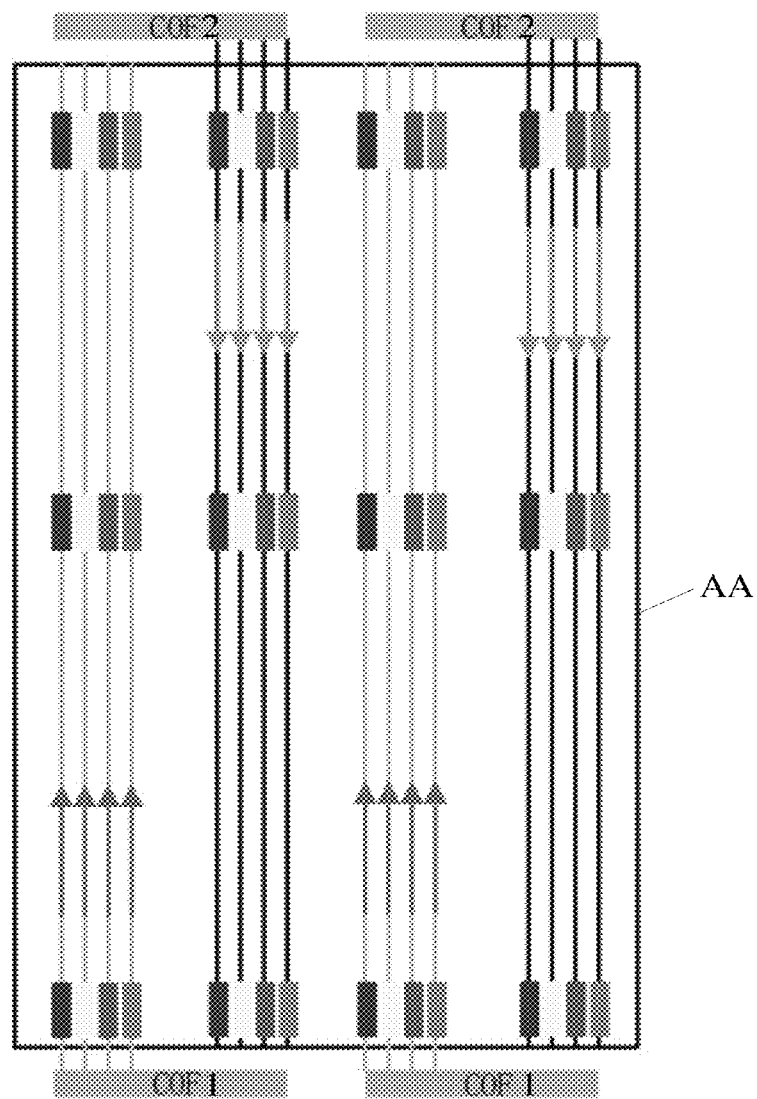
FIG. 6C is yet still another schematic plan view of the display panel provided by at least one embodiment of the present disclosure.

For example, as illustrated in FIG. 6C, the plurality of columns of display sub-pixels P are divided into a plurality of groups, and each group includes four columns of display sub-pixels P (one column of repeating units). In this case, the first chip-on-film COF1 may be configured to provide electrical signals, such as data signals, power signals, etc., to display sub-pixels P in odd-numbered groups, and the second chip-on-film COF2 is configured to provide electrical signals, such as data signals, power signals, etc., to display sub-pixels P in even-numbered groups; or the first chip-on-film COF1 is configured to provide electrical signals to display sub-pixels P in even-numbered groups, and the second chip-on-film COF2 is configured to provide electrical signals to display sub-pixels P in odd-numbered groups.

Figure 6D:
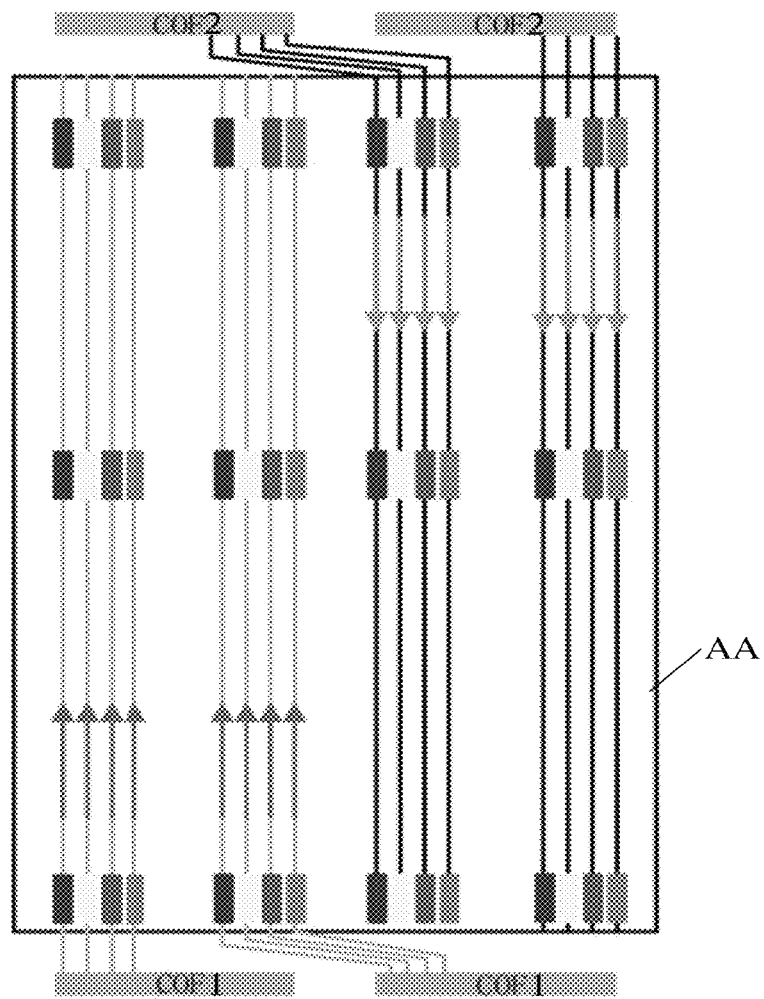
FIG. 6D is yet still another schematic plan view of the display panel provided by at least one embodiment of the present disclosure.

For example, in other embodiments, as illustrated in FIG. 6D, the plurality of columns of display sub-pixels P are divided into two parts, such as a left part and a right part in the figure. In this case, the first chip-on-film COF1 may be configured to provide electrical signals, such as data signals, power signals, etc., to the plurality of columns of display sub-pixels P in the left part, and the second chip-on-film COF2 is configured to provide electrical signals, such as data signals, power signals, etc., to the plurality of columns of display sub-pixels P in the right part; or the first chip-on-film COF1 is configured to provide electrical signals to the plurality of columns of display sub-pixels P in the right part, and the second chip-on-film COF2 is configured to provide electrical signals to the plurality of columns of display sub-pixels P in the left part. The embodiments of the present disclosure do not limit the specific configuration of the first chip-on-film COF1 and the second chip-on-film COF2.

In the embodiments of the present disclosure, compared with the technical solution of arranging the chip-on-film on only one side of the display region AA, arranging the chip-on-films on both the first side 10 and the second side 20 of the display region AA can reduce and balance the bezel widths of the first side 10 and the second side 20, so as to avoid a wider bezel on one side of the display region, thereby helping to implement the narrow bezel design and the large-screen display. In addition, by arranging the at least one first chip-on-film COF1 and the at least one second chip-on-film COF2 to be centrosymmetric with respect to the center O of the display region AA, the uniformity of the first chip-on-film COF1 and the second chip-on-film COF2 providing electrical signals to the display region AA can be improved, so as to improve the display uniformity of the display panel.

In the embodiments of the present disclosure, because the first side 10 and the second side 20 of the display region AA have substantially the same or similar structure, the first side 10 is taken as an example for description below, and the structure of the second side 20 may refer to the description of the first side 10.

Figure 7:
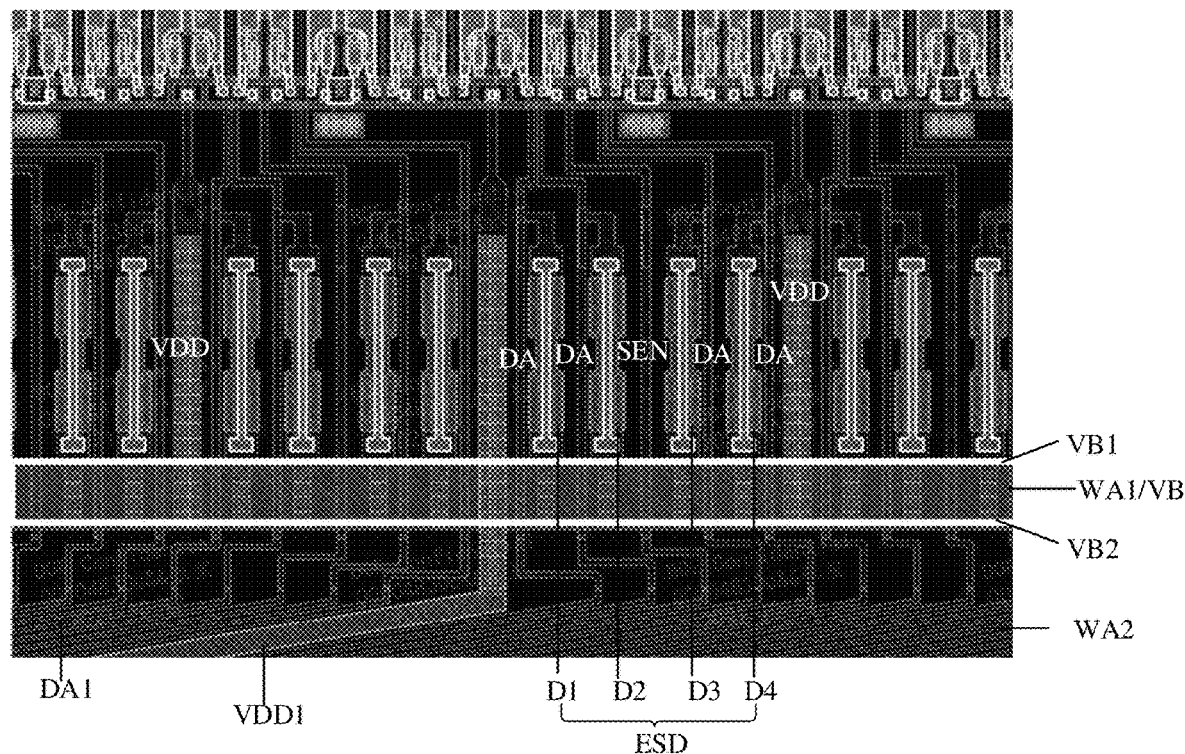
FIG. 7 is a schematic partial plan view of a first side of a display region of a display panel provided by at least one embodiment of the present disclosure.

For example, FIG. 7 illustrates a schematic diagram of the circuit region on the first side. As illustrated in FIG. 7, the circuit region WR further includes an electrostatic discharge circuit ESD on the first side 10 and the second side 20, respectively, the plurality of wires include a sensing line SEN extending in a first direction (the vertical direction in the figure), and the sensing line SEN is configured to provide a sensing signal to the pixel driving circuit (for details, please refer to the description of FIG. 1A and FIG. 1B). For example, the electrostatic discharge circuit ESD includes a plurality of electrostatic discharge portions, four portions are illustrated as an example in the figure, that is, a first portion D1, a second portion D2, a third portion D3 and a fourth portion D4. In a second direction (the horizontal direction in the figure) perpendicular to the first direction, the plurality of electrostatic discharge portions D1-D4 are symmetrically distributed with respect to the sensing line SEN.

For example, referring to FIG. 4, the electrostatic discharge circuit ESD may be on the side of the power bus region WA1 (described later) close to the display region AA, for example, may be provided at the position illustrated by the dotted frame in the figure.

For example, in some embodiments, as illustrated in FIG. 7, the plurality of wires further include a plurality of data lines DA extending along the first direction, the plurality of data lines DA are configured to provide a data signal to the pixel driving circuit (for details, please refer to the description of FIG. 1A and FIG. 1B), and the plurality of data lines DA are respectively on the side of the plurality of electrostatic discharge portions ESD away from the sensing line SEN. For example, on the left side of the sensing line SEN in FIG. 7, a plurality of data lines DA are respectively on the left side of the plurality of electrostatic discharge portions ESD, and on the right side of the sensing line SEN, a plurality of data lines DA are respectively on the right side of the plurality of electrostatic discharge portions ESD. Thus, the electrostatic discharge portions ESD can space the sensing line SEN from the data line DA, and can prevent signal crosstalk from occurring between the sensing line SEN and the data line DA.

For example, in some embodiments, as illustrated in FIG. 3, the display region AA further includes a passivation layer 1019 on the side of the pixel driving circuit layer away from the base substrate 110, as illustrated in FIG. 4 and FIG. 5, the passivation layer 1019 further extends to the circuit region WA and is on the side of the plurality of wires away from the base substrate 110, and the frame sealant F is on the side of the passivation layer 1019 away from the base substrate 110 and is in direct contact with the passivation layer 1019. Thus, there are no electrode layers (such as the second electrode layer 1041 and the first electrode layer 1043), planarization layer 1016, pixel definition layer 1017 and other functional layers below the frame sealant F, which can prevent impurities such as water and oxygen from entering into the display panel along the interface of these functional layers and damaging the structure of the display panel.

For example, in some embodiments, as illustrated in FIG. 4, in the direction away from the display region AA, the circuit region WA includes a power bus region WA1, a fan-out signal line region WA2 and a transfer signal line region WA3 on the first side 10 and the second side 20, respectively, and the frame sealant F includes a first part F1 in the fan-out signal line region WA2 and a second part F2 in the transfer signal line region WA3. That is, the frame sealant F covers both the fan-out signal line region WA2 and the transfer signal line region WA3, so that the frame sealant F occupies substantially the same space as the fan-out signal line region WA2 and the transfer signal line region WA3 on the base substrate 110, thereby contributing to the implementation of the narrow bezel design.

For example, in some embodiments, as illustrated in FIG. 7, the power bus region WA1 includes a first power bus VB, and the width of the first power bus VB may range from 50 μm to 90 μm, such as 60 μm or 70 μm. A first end VB1 of the first power bus VB is electrically connected to first power lines VDD of the plurality of display sub-pixels P. The first power line VDD is, for example, a power line that provides a high-level signal. For example, in some embodiments, the electrostatic discharge portions ESD may be connected to the first power bus VB to obtain an electrical signal from the first power bus VB.

For example, in some embodiments, a second end VB2 of the first power bus VB opposite to the first end VB1 is connected to the at least one first chip-on-film COF1 or the at least one second chip-on-film COF2 through a plurality of power lead lines, respectively.

For example, as illustrated in FIG. 7, the fan-out signal line region WA2 includes a plurality of fan-out signal lines DA1, and in the fan-out signal line region WA2, the plurality of fan-out signal lines DA1 and the plurality of power lead lines VDD1 (one is shown as an example in FIG. 7) are alternately arranged. For example, the fan-out signal line DA1 includes a data line lead line for electrically connecting the data line DA to the at least one first chip-on-film COF1 or the at least one second chip-on-film COF2.

In the embodiments of the present disclosure, the first power lines VDD of a plurality of display sub-pixels P are connected to the chip-on-film through a structure combining the first power bus VB and the plurality of power lead lines VDD1, compared with the technical solution in which the first power lines VDD of a plurality of display sub-pixels P are connected to the chip-on-film only through the first power bus VB (in this technical solution, the width of the first power bus VB needs to reach about 2000 μm), the structure provided by the embodiments of the present disclosure can greatly reduce the width of the first power bus VB, so as to implement the narrow bezel design, for example, implement the extremely narrow bezel design.

Figure 8:
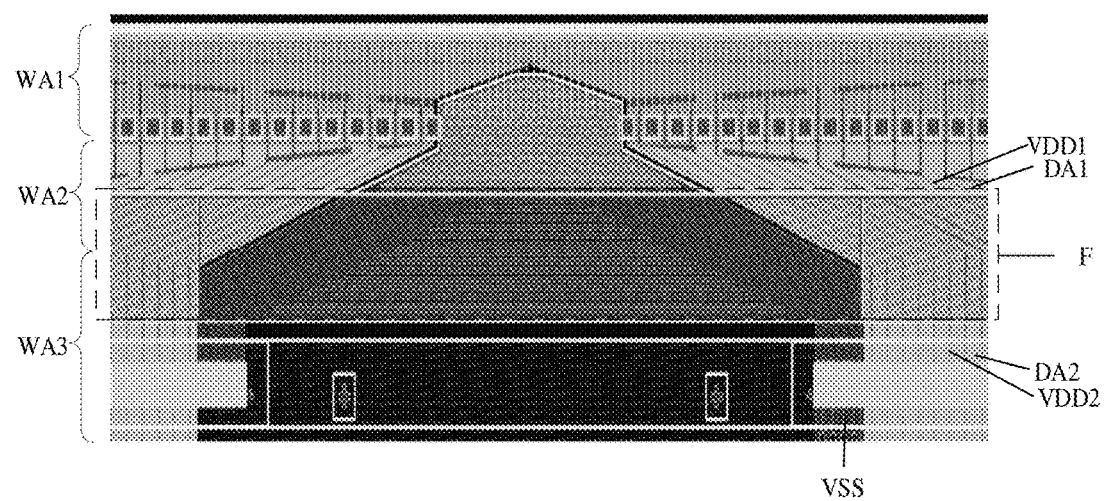
FIG. 8 is another schematic partial plan view of a first side of a display region of a display panel provided

For example, FIG. 8 illustrates a schematic plan view of a circuit region on the first side and the second side. As illustrated in FIG. 8, the transfer signal line region WA3 includes a plurality of transfer signal lines DA2 and a plurality of transfer signal lines VDD2, the plurality of transfer signal lines DA2 respectively connect the plurality of fan-out signal lines DA1 to the at least one first chip-on-film COF1 or the at least one second chip-on-film COF2, and the plurality of transfer signal lines VDD2 respectively connect the plurality of power lead lines VDD1 to the at least one first chip-on-film COF1 or the at least one second chip-on-film COF2.

For example, the transfer signal line region WA3 further includes a second power bus VSS, and the second power bus VSS is in a shape of a sheet and is used to provide a low-level power signal to the pixel driving circuit. For example, the second power bus VSS is electrically connected to the first electrode layer 1043 through a second power line. The second power bus VSS may also be connected to the at least one first chip-on-film COF or the at least one second chip-on-film COF2.

For example, in some embodiments, as illustrated in FIG. 4, the at least one groove GV includes a first groove GV1 on the first side 10 and the second side 20, respectively, and in the direction perpendicular to the base substrate 110 (i.e., the vertical direction in the figure), at least a part of the first groove GV1 is in the power bus region WA1, so that the at least a part of the first groove GV1 overlaps with the first power bus VB in the power bus region WA1.

For example, as illustrated in FIG. 2, the at least one side further includes a third side 30 and a fourth side 40 on opposite sides of the display region AA, and the third side 30 and the fourth side 40, for example, have substantially the same or similar structure. For example, as illustrated in FIG. 5, the third side 30 and the fourth side 40 respectively include a first gate scanning driving circuit GOA1 and a second gate scanning driving circuit GOA2, and the first scanning driving circuit GOA1 is on the side of the second scanning driving circuit GOA2 close to the display region AA. One of the first gate scanning driving circuit GOA1 and the second gate scanning driving circuit GOA2 is a row scanning driving circuit and is configured to provide a row scanning signal to the plurality of display sub-pixels P, and the other of the first gate scanning driving circuit GOA1 and the second gate scanning driving circuit GOA2 is a light-emitting scanning driving circuit and is configured to provide a light-emitting control signal to the plurality of display sub-pixels P. For example, the at least one groove GV includes a second groove GV2 between the first gate scanning driving circuit GOA1 and the second gate scanning driving circuit GOA2.

Figure 9:
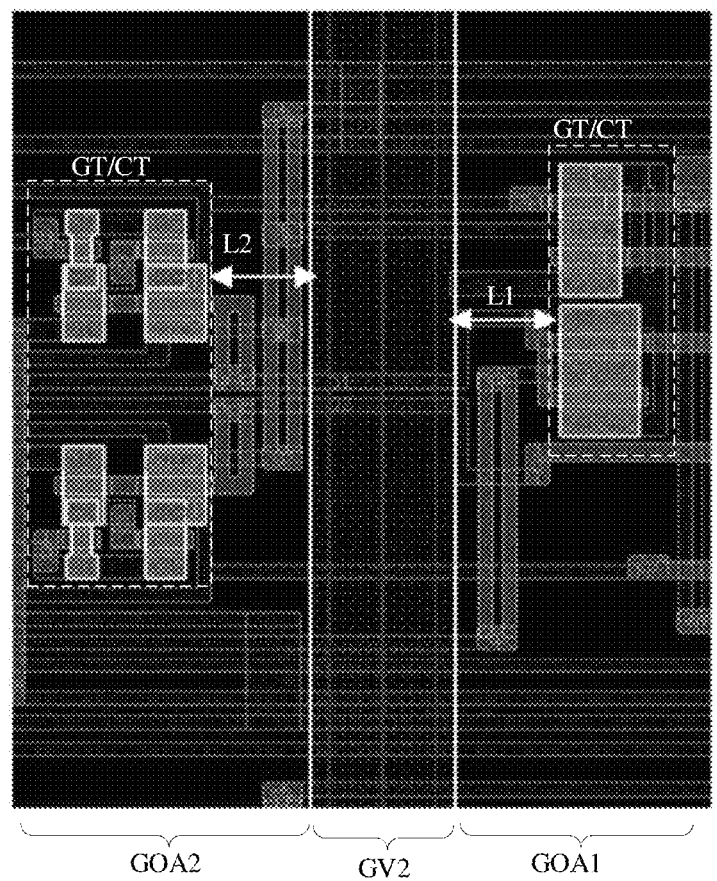
FIG. 9 is a schematic partial plan view of a third side of a display region of a display panel provided by at least one embodiment of the present disclosure.

For example, FIG. 9 illustrates a schematic plan view of the first gate scanning driving circuit GOA1, the second gate scanning driving circuit GOA2, and the second groove GV2. For example, as illustrated in FIG. 9, the first gate scanning driving circuit GOA1 and the second gate scanning driving circuit GOA2 respectively include a plurality of shift register units connected in cascade, and each shift register unit includes structures such as a plurality of thin film transistors, a storage capacitor, and the like. For example, in some examples, the shift register unit may be formed as a 4T1C structure, that is, the shift register unit includes at least four transistors and one capacitor to implement functions such as signal input, signal output, register reset, and the like, and may also include more transistors and/or capacitors. For example, sub-circuits used to implement functions such as pull-up node control, pull-down node control, noise reduction, and the like may be added, so as to implement more stable input, output and reset.

For example, the structures of the plurality of thin film transistors and the storage capacitor included in the shift register unit may be substantially the same as the structures of the plurality of thin film transistors T and the storage capacitor C of the pixel driving circuit. For example, the structures of the plurality of thin film transistors and the storage capacitor included in the shift register unit may be provided in the same layer as the structures of the plurality of thin film transistors T and the storage capacitor C of the pixel driving circuit, that is, respective functional layers of the plurality of thin film transistors and the storage capacitor included in the shift register unit may be provided respectively in the same layer as the corresponding respective functional layers of the plurality of thin film transistors T and the storage capacitor C of the pixel driving circuit, so that the above structures can be formed together in the manufacturing process, and the manufacturing process of the display panel is simplified.

For example, as illustrated in FIG. 2, the display region AA may further include a pixel definition layer 1017 on the side of the planarization layer 1016 away from the base substrate 110, the pixel definition layer 1017 includes a plurality of sub-pixel openings, and the sub-pixel openings expose the second electrode layer 1041 for defining the light-emitting region of the light-emitting device EM. For example, the pixel definition layer 1017 further extends to the circuit region WA, and the groove GV (including the first groove GV1 and the second groove GV2) penetrates through the planarization layer 1016 and the pixel definition layer 1017. That is, in the manufacturing process of the display panel, the groove GV is formed by removing part of the material of the planarization layer 1016 and the pixel definition layer 1017.

For example, as illustrated in FIG. 9, the region illustrated by the dotted frame is the arrangement region of the structures such as the plurality of thin film transistors GT and the storage capacitor CT of the shift register units of the first gate scanning driving circuit GOA1 and the second gate scanning driving circuit GOA2. In the first gate scanning driving circuit GOA1, a distance L1 between the above-mentioned structures and the second groove GV2 ranges from 40 μm to 60 μm, such as 50 μm, etc. In the second gate scanning driving circuit GOA2, a distance L2 between the above-mentioned structures and the second groove GV2 ranges from 40 μm to 60 μm, such as 50 μm, etc. Therefore, in the manufacturing process of the display panel, when the second groove GV2 is formed by an etching process, such as a plasma etching process, the above-mentioned distance (such as the distance L1 or L2) can prevent the plasma used in the etching process from causing adverse influences on structures such as thin film transistors.

For example, in some embodiments, the first electrode layer 1043 in the light-emitting device layer is continuously arranged, that is, the first electrode layers 1043 of the plurality of light-emitting devices EM in the light-emitting device layer have an integrated structure. For example, on the first side 10 and the second side 20, as illustrated in FIG. 4, in the direction perpendicular to the base substrate 110, the first electrode layer 1043 at least partially overlaps with the first groove GV1; and on the third side 30 and the fourth side 40, as illustrated in FIG. 5, in the direction perpendicular to the base substrate 110, the first electrode layer 1043 does not overlap with the second groove GV2.

For example, as illustrated in FIG. 2, the first inorganic encapsulation layer 1051 and/or the third inorganic encapsulation layer 1053 extend to the side of the frame sealant F close to the base substrate 110. For example, as illustrated in FIG. 5, the circuit region WR further includes a plurality of clock signal lines CL on the third side 30 and the fourth side 40, respectively, and the plurality of clock signal lines CL are provided on the side of the second scanning driving circuit GOA2 away from the display region AA, and in a region CLK. The orthographic projections of the plurality of clock signal lines CL on the base substrate 110 are within the orthographic projection of the first inorganic encapsulation layer 1051 and/or the third inorganic encapsulation layer 1053 on the base substrate 110.

For example, in some embodiments, as illustrated in FIG. 4, on the first side 10 and the second side 20, the first inorganic encapsulation layer 1051 and/or the third inorganic encapsulation layer 1053 terminate in the fan-out signal line region WA2.

For example, in some embodiments, on the first side 10, the second side 20, the third side 30 and the fourth side 40, the first inorganic encapsulation layer 1051 and/or the third inorganic encapsulation layer 1053 terminate on a surface of the frame sealant F close to the base substrate 110, that is, the first inorganic encapsulation layer 1051 and/or the third inorganic encapsulation layer 1053 terminate in a middle portion of the frame sealant F, so that the frame sealant F also seals the encapsulation layer EN. Thus, efficient packaging of the display panel can be implemented.

For example, in some embodiments, as illustrated in FIG. 2, the display region AA further includes a black matrix layer BM on the side of the encapsulation layer EN away from the base substrate 110, and the black matrix layer BM further extends into the circuit region WA on the third side 30 and the fourth side 40. The first gate scanning driving circuit GOA1 and the second gate scanning driving circuit GOA2 respectively include a plurality of thin film transistors GT (referring to FIG. 9), and the orthographic projections of the plurality of thin film transistors GT on the base substrate 110 are within the orthographic projection of the black matrix layer BM on the base substrate 110. Therefore, the black matrix layer BM can also block the plurality of thin film transistors GT, so as to prevent external light from irradiating the plurality of thin film transistors GT and affecting the performance of the plurality of thin film transistors GT.

For example, the orthographic projections of the plurality of clock signal lines CL on the base substrate 110 do not overlap with the orthographic projection of the black matrix layer BM on the base substrate 110. For example, as illustrated in FIG. 5, the frame sealant F may completely cover the plurality of clock signal lines CL, that is, the orthographic projection of the region CLK on the base substrate 110 is within the orthographic projection of the frame sealant F on the base substrate 110. In this case, the region CLK and the frame sealant F substantially occupy the same space on the base substrate 110, thereby contributing to the narrow bezel design.

For example, in some embodiments, the display panel may further include some detection structures to detect or infer whether one of more regions of the display panel can work normally.

For example, in some embodiments, as illustrated in FIG. 2 and FIG. 5, the display panel may further include a display region detection structure TE1 (a part illustrated by a dotted rectangle), and the display region detection structure TE1 is in a region close to the display region AA. For example, the display region detection structure TE1 may be provided in the dummy pixel region XA or the circuit region WA, or a part of the display region detection structure TE1 may be provided in the dummy pixel region XA, and the other part may be provided in the circuit region WA, for another example, the display region detection structure TE1 may be provided at the positions of four corners of the display region AA, so as to detect whether the display region AA can work normally. For example, the orthographic projection of the display region detection structure TE1 on the base substrate 110 is within the orthographic projection of the encapsulation layer EN on the base substrate 110.

For example, the display region detection structure TE1 includes, for example, 2×2 repeating units or 3×3 repeating units, and as described above, each repeating unit includes three or four sub-pixels. For example, these repeating units of the display region detection structure TE1 have substantially the same structure as the repeating units in the display region AA, so that it can be inferred whether the repeating units in the display region AA can work normally by detecting the repeating units in the display region detection structure TE1. For example, in the case where the display region detection structure TE1 has, for example, 3×3 repeating units, the repeating unit located in a central region of the 3×3 repeating units can be detected to infer whether the repeating units in the display region AA can work normally. Because the repeating unit in the central region have substantially the same environment as the repeating units in the display region AA, that is, being surrounded by a plurality of repeating units, the detection result obtained by detecting the repeating unit in the central region is more accurate.

For example, in some embodiments, as illustrated in FIG. 2 and FIG. 5, the display panel may further include a signal line voltage drop detection structure TE2 (a part illustrated by a dotted circle). The signal line voltage drop detection structure TE2 is, for example, used to detect the voltage drop of the second power line connected to the second power bus VSS, thereby detecting whether the voltages transmitted to first electrode layers 1043 of respective light emitting devices EM are substantially consistent. For example, the first electrode layers 1043 of respective light-emitting devices EM are electrically connected to a detection electrode in a source and drain electrode layer through vias in the pixel definition layer 1017, the passivation layer 1019 and the planarization layer, respectively, and the voltage drop (IR) detection is performed by applying the same current to the detection electrode. For example, in some embodiments, because the first electrode layer 1043 of the display sub-pixel P in the middle row of the display panel is the farthest from the second power bus VSS, it is possible to infer whether the voltage drop (IR) meets the requirements through the voltage drop detection of the second power line in the middle row region of the display panel. For example, in some examples, the voltage drop of the second power lines in different regions of the display panel can also be detected, for example, the signal line voltage drop detection structure TE2 is also arranged between the middle row region and the second power bus VSS to obtain the change trend of the voltage drop (IR).

For example, in some embodiments, as illustrated in FIG. 6A, the display panel may further include a gate scanning circuit detection structure TE3, and the gate scanning circuit detection structure TE3 includes, for example, some pins in the first chip-on-film COF and/or the second chip-on film COF2. Therefore, it is possible to detect whether the gate scanning circuit connected to the some pins, such as the first gate scanning driving circuit GOA1 and the second gate scanning driving circuit GOA2, can work normally by connecting the some pins to a external detection circuit.

For example, in the embodiments of the present disclosure, the encapsulation effect of the display panel can also be improved by designing the extension distance of each functional layer.

For example, in some embodiments, as illustrated in FIG. 4, on the first side 10 and the second side 20, the light-emitting material layer 1042 may extend to the outside of the display region AA, for example, the distance W1 beyond the display region AA ranges from 0.2 mm to 0.4 mm, such as 0.3 mm; for example, the distance W2 between the edge of the first groove GV1 close to the display region AA and the light-emitting material layer 1042 may range from 1.5 mm to 1.7 mm, such as 1.6 mm, and the width W3 of the first groove GV1 may range from 0.5 mm to 0.6 mm, such as 0.54 mm; the distance W4 between the edge of the first electrode layer 1043 away from the display region AA and the edge of the first groove GV1 away from the display region AA may range from 0.2 mm to 0.3 mm, such as 0.26 mm; the distance W5 between the edges of the planarization layer 1016 and the pixel definition layer 1017 away from the display region AA and the edge of the first electrode layer 1043 away from the display region AA may range from 1.0 mm to 1.1 mm, such as 1.04 mm; the distance W6 between the edge of the encapsulation layer EN away from the display region AA and the edges of the planarization layer 1016 and the pixel definition layer 1017 away from the display region AA ranges from 0.9 mm to 1.0 mm, such as 0.96 mm; the distance W7 between the edge of the frame sealant F away from the display region AA and the edge of the encapsulation layer EN away from the display region AA ranges from 1.8 mm to 1.9 mm, such as 1.85 mm; the distance W8 between the edge of the transfer signal line region WA3 away from the display region AA and the edge of the frame sealant F away from the display region AA ranges from 0.9 mm to 1.1 mm, such as 1.0 mm; the width W9 of the binding region BA ranges from 0.9 mm to 1.1 mm, such as 1.0 mm; and the distance W10 between the edge of the binding region BA away from the display region AA and the edge of the base substrate 110 ranges from 0.4 mm to 0.5 mm, such as 0.45 mm. For example, the width W11 of the frame sealant F ranges from 2.5 mm to 3.0 mm, such as 2.8 mm.

For example, in some embodiments, as illustrated in FIG. 5, on the third side 30 and the fourth side 40, the width H1 of the dummy pixel region XA may range from 0.2 mm to 0.4 mm, such as 0.3 mm, for example, the width of the dummy pixel region XA on the first side 10 and the second side 20 may also range from 0.2 mm to 0.4 mm, such as 0.3 mm. For example, the light-emitting material layer 1042 may extend to the outside of the display region AA, for example, the distance beyond the display region AA also ranges from 0.2 mm to 0.4 mm, such as 0.3 mm. For example, the distance H2 between the edge of the first electrode layer 1043 away from the display region AA and the edge of the light-emitting material layer 1042 away from the display region AA may range from 0.6 mm to 0.8 mm, such as 0.7 mm; the distance H3 between the edge of the second groove GV2 close to the display region AA and the edge of the first electrode layer 1043 away from the display region AA may range from 1.7 mm to 1.9 mm, such as 1.8 mm; the width H4 of the second groove GV2 may range from 0.1 mm to 0.2 mm, such as 0.16 mm; the distance H5 between the edge of the frame sealant F close to the display region AA and the edge of the second groove GV2 away from the display region AA may range from 1.5 mm to 1.6 mm, such as 1.54 mm; the width H6 of the region CLK may range from 1.4 mm to 1.6 mm, such as 1.5 mm; the distance H7 between the edge of the encapsulation layer EN away from the display region AA and the edge of the region CLK away from the display region AA may range from 0.3 mm to 0.4 mm, such as 0.35 mm; the distance H8 between the edge of the frame sealant F away from the display region AA and the edge of the encapsulation layer EN away from the display region AA may range from 0.9 mm to 1.1 mm, such as 1.0 mm; and the distance H9 between the edge of the frame sealant F away from the display region AA and the edge of the base substrate may range from 0.2 mm to 0.3 mm, such as 0.25 mm. The width H10 of the frame sealant F may range from 2.5 mm to 3.0 mm, such as 2.8 mm. For example, the width W11 of the frame sealant F on the first side 10 and the second side 20 is the same as the width H10 of the frame sealant F on the third side 30 and the fourth side 40.

In the embodiments of the present disclosure, the encapsulation effect of the display panel can be improved by performing the above-mentioned designs on each functional layer, furthermore, the design of the narrow bezel (e.g., the extremely narrow bezel) can be achieved at the same time.

For example, in the embodiments of the present disclosure, the base substrate 110 may be a rigid substrate made of glass, quartz, or the like, or a flexible substrate made of polyimide, or the like. The gate electrode 1022 may be made of a metal material such as copper (Cu), aluminum (Al), titanium (Ti), molybdenum (Mo), or the like, or an alloy material, for example, the gate electrode 1022 is formed into a single-layer metal layer structure or a multi-layer metal layer structure, for example, a multi-layer metal layer structure such as titanium/aluminum/titanium. The source and drain electrodes 1023 and 1024 may be made of a metal material such as copper (Cu), aluminum (Al), titanium (Ti), molybdenum (Mo), or the like, or an alloy material, for example, the source and drain electrodes 1023 and 1024 are formed into a single-layer metal layer structure or a multi-layer metal layer structure, for example, a multi-layer metal layer structure such as titanium/aluminum/titanium. The materials of the first electrode plate 1031 and the second electrode plate 1032 include a metal material such as aluminum, titanium, cobalt, copper, or the like, or an alloy material. The active layer 1021 may be made of a material such as polysilicon, metal oxide, or the like.

For example, as illustrated in FIG. 3, the display panel further includes a barrier layer 1112 and a buffer layer 1013 on the base substrate 110, and the barrier layer 1112 and the buffer layer 1013 can prevent impurities in the base substrate 110 from entering into the plurality of functional layers on the display substrate 110, thereby playing a protective role. For example, the barrier layer 1112, the buffer layer 1013, the gate insulating layer 1014 (including the first gate insulating layer 1014A and the second gate insulating layer 1014B), the interlayer insulating layer 1015, and the first inorganic encapsulation layer 1051 and the second inorganic encapsulation layer 1053 of the encapsulation layer EN may be made of an inorganic insulating material such as silicon oxide, silicon nitride, or silicon oxynitride.

For example, as illustrated in FIG. 3, the display panel further includes a spacer layer 1018 on the pixel definition layer 1017, and the spacer layer 1018 is used to define an encapsulation space. For example, the planarization layer 1016, the pixel definition layer 1017, the spacer layer 1018 and the first organic encapsulation layer 1052 of the encapsulation layer EN may be made of an organic insulating material such as polyimide, resin, or the like.

For example, as illustrated in FIG. 3 to FIG. 5, the display panel may further include a cover plate COV, and the cover plate COV may be connected to the base substrate 110 on which the above-mentioned functional structures are formed by the frame sealant F, for example, the cover plate COV may be a glass cover plate.

For example, the display panel may further include other structures in addition to the above-mentioned structures. For details, reference may be made to the related art, which will not be repeated here.

In addition, it should be noted that the embodiments of the present disclosure do not limit the material of each functional layer, and the material of each functional layer is not limited to the above-mentioned examples. In the embodiments of the present disclosure, each thin film transistor may be a P-type thin film transistor or an N-type thin film transistor, and the structure may be a bottom-gate type, a top-gate type or a dual-gate type. The structures illustrated in the drawings are only exemplary, and the specific form of each thin film transistor is not limited in the embodiments of the present disclosure.

At least one embodiment of the present disclosure further provides a display device, the display device includes any one of the above-mentioned display panels, and the display device can be implemented as a large-size, narrow-bezel display device. For example, the display device may be any product or component with a display function, such as a mobile phone, a tablet computer, a television, a monitor, a notebook computer, a digital photo frame, a navigator, or the like.

The following statements should be noted:
(1) The drawings involve only the structure(s) in connection with the embodiment(s) of the present disclosure, and other structure(s) can be referred to common design(s).
(2) For clarity, in the drawings used to describe the embodiments of the present disclosure, the thicknesses of layers or regions are enlarged or reduced, that is, the drawings are not drawn to actual scale. It can be understood that when a component such as a layer, film, region or substrate is referred to as being "on" or "under" another component, the component may be "directly" "on" or "under" another component, or one or more intermediate components may be interposed therebetween.
(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A display panel, having a display region, and a dummy pixel region and a circuit region sequentially arranged on at least one side of the display region and in a direction away from the display region, and comprising a base substrate,
wherein the display region has a plurality of display sub-pixels arranged in a plurality of rows and columns, and comprises a pixel driving circuit layer on the base substrate, a planarization layer on a side of the pixel driving circuit layer away from the base substrate, a light-emitting device layer on a side of the planarization layer away from the base substrate, and an encapsulation layer on a side of the light-emitting device layer away from the base substrate, and each of the plurality of the display sub-pixels comprises a pixel driving circuit in the pixel driving circuit layer and a light-emitting device in the light-emitting device layer;
the dummy pixel region comprises a plurality of dummy sub-pixels on the base substrate;
the circuit region comprises a plurality of wires on the base substrate and a frame sealant on a side of the plurality of wires away from the base substrate;
in a direction perpendicular to the base substrate, the frame sealant overlaps with at least a part of the plurality of wires, the encapsulation layer further extends to the circuit region, and overlaps with at least a part of the frame sealant, the planarization layer further extends to the circuit region, and comprises at least one groove in the circuit region, and the at least one groove overlaps with at least a part of the plurality of wires; and
the at least one side comprises a first side and a second side on opposite sides of the display region, the first side and the second side further comprise a binding region on a side of the circuit region away from the display region, the binding region comprises a first binding region on the first side and a second binding region on the second side, the first binding region comprises at least one first chip-on-film, the second binding region comprises at least one second chip-on-film, and the at least one first chip-on-film and the at least one second chip-on-film are centrosymmetric with respect to a center of the display region.

2. The display panel according to claim 1, wherein the first chip-on-film is configured to provide electrical signals to display sub-pixels in odd-numbered columns among the plurality of rows and columns of display sub-pixels, and the second chip-on-film is configured to provide electrical signals to display sub-pixels in even-numbered columns among the plurality of rows and columns of display sub-pixels; or
the first chip-on-film is configured to provide electrical signals to display sub-pixels in even-numbered columns among the plurality of rows and columns of display sub-pixels, and the second chip-on-film is configured to provide electrical signals to display sub-pixels in odd-numbered columns among the plurality of rows and columns of display sub-pixels.

3. The display panel according to claim 2, wherein the display region further comprises a passivation layer on a side of the pixel driving circuit layer away from the base substrate, the passivation layer further extends to the circuit region and is on a side of the plurality of wires away from the base substrate, and
the frame sealant is on a side of the passivation layer away from the base substrate and is in direct contact with the passivation layer.

4. The display panel according to claim 1, wherein the circuit region further comprises an electrostatic discharge circuit on the first side and the second side, respectively, the plurality of wires comprise a sensing line extending in a first direction, and the sensing line is configured to provide a sensing signal to the pixel driving circuit; and
the electrostatic discharge circuit comprises a plurality of electrostatic discharge portions, and in a second direction perpendicular to the first direction, the plurality of electrostatic discharge portions are symmetrically distributed with respect to the sensing line.

5. The display panel according to claim 4, wherein the plurality of wires further comprise a plurality of data lines extending along the first direction, the plurality of data lines are configured to provide a data signal to the pixel driving circuit, and
the plurality of data lines are respectively on a side of the plurality of electrostatic discharge portions away from the sensing line.

6. The display panel according to claim 1, wherein the display region further comprises a passivation layer on a side of the pixel driving circuit layer away from the base substrate, the passivation layer further extends to the circuit region and is on a side of the plurality of wires away from the base substrate, and
the frame sealant is on a side of the passivation layer away from the base substrate and is in direct contact with the passivation layer.

7. The display panel according to claim 1, wherein in a direction away from the display region, the circuit region comprises a power bus region, a fan-out signal line region and a transfer signal line region on the first side and the second side, respectively, and the frame sealant comprises a first part in the fan-out signal line region and a second part in the transfer signal line region.

8. The display panel according to claim 7, wherein the power bus region comprises a first power bus, and a first end of the first power bus is electrically connected to first power lines of the plurality of display sub-pixels.

9. The display panel according to claim 8, wherein a second end of the first power bus opposite to the first end is connected to the at least one first chip-on-film or the at least one second chip-on-film through a plurality of power lead lines, respectively.

10. The display panel according to claim 9, wherein the fan-out signal line region comprises a plurality of fan-out signal lines, and in the fan-out signal line region, the plurality of fan-out signal lines and the plurality of power lead lines are alternately arranged.

11. The display panel according to claim 7, wherein the at least one groove comprises a first groove on the first side and the second side, respectively, and in the direction perpendicular to the base substrate, at least a part of the first groove is in the power bus region.

12. The display panel according to claim 11, wherein the at least one side further comprises a third side and a fourth side on opposite sides of the display region, the third side and the fourth side respectively comprise a first gate scanning driving circuit and a second gate scanning driving circuit, and the first scanning driving circuit is on a side of the second scanning driving circuit close to the display region;

one of the first gate scanning driving circuit and the second gate scanning driving circuit is a row scanning driving circuit and is configured to provide a row scanning signal to the plurality of display sub-pixels, and another one of the first gate scanning driving circuit and the second gate scanning driving circuit is a light-emitting scanning driving circuit and is configured to provide a light-emitting control signal to the plurality of display sub-pixels; and the at least one groove further comprises a second groove between the first gate scanning driving circuit and the second gate scanning driving circuit.

13. The display panel according to claim 12, wherein the encapsulation layer comprises an inorganic encapsulation layer, and the inorganic encapsulation layer extends to a side of the frame sealant close to the base substrate;

the circuit region further comprises a plurality of clock signal lines on the third side and the fourth side, respectively, and the plurality of clock signal lines are on a side of the second scanning driving circuit away from the display region; and orthographic projections of the plurality of clock signal lines on the base substrate are within an orthographic projection of the inorganic encapsulation layer on the base substrate.

14. The display panel according to claim 13, wherein on the first side and the second side, the inorganic encapsulation layer terminates in the fan-out signal line region.

15. The display panel according to claim 13, wherein on the first side, the second side, the third side and the fourth side, the inorganic encapsulation layer terminates on a surface of the frame sealant close to the base substrate.

16. The display panel according to claim 13, wherein the display region further comprises a black matrix layer on a side of the encapsulation layer away from the base substrate;

the black matrix layer extends into the circuit region on the third side and the fourth side; and the first gate scanning driving circuit and the second gate scanning driving circuit respectively comprise a plurality of thin film transistors, and orthographic projections of the plurality of thin film transistors on the base substrate are within an orthographic projection of the black matrix layer on the base substrate.

17. The display panel according to claim 16, wherein orthographic projections of the plurality of clock signal lines on the base substrate do not overlap with the orthographic projection of the black matrix layer on the base substrate.

18. The display panel according to claim 10, wherein the light-emitting device layer comprises a first electrode layer that is continuously arranged for the light-emitting device;

on the first side and the second side and in the direction perpendicular to the base substrate, the first electrode layer at least partially overlaps with the first groove; and on the third side and the fourth side and in the direction perpendicular to the base substrate, the first electrode layer does not overlap with the second groove.

19. The display panel according to claim 1, wherein the display region further comprises a pixel definition layer on a side of the planarization layer away from the base substrate, and the at least one groove penetrates through the planarization layer and the pixel definition layer.

20. A display device, comprising the display panel according to claim 1.

* * * * *

UNITED STATES PATENT AND TRADEMARK OFFICE
CERTIFICATE OF CORRECTION

PATENT NO. : 12,389,770 B2  
APPLICATION NO. : 17/927051  
DATED : August 12, 2025  
INVENTOR(S) : Xing Zhang et al.

Page 1 of 1

It is certified that error appears in the above-identified patent and that said Letters Patent is hereby corrected as shown below:

In the Claims

In Column 22, Line 34 (Line 1 of Claim 18), please change:
"according to claim 10"
To correctly read:
-- according to claim 11 --

Signed and Sealed this  
Second Day of December, 2025

John A. Squires  
*Director of the United States Patent and Trademark Office*